United States Patent [19]

Kan et al.

[11] Patent Number: 4,987,214

[45] Date of Patent: Jan. 22, 1991

[54] IMIDE TYPE PREPOLYMER COMPOSITION COMPRISING UNSATURATED BIS IMIDE, DIAMINE, AND A TERTIARY BUTYL HYDROQUINONE POLYMERIZATION INHIBITOR

[75] Inventors: Kojiro Kan; Toru Tomoshige; Hideya Aoki, all of Ichihara, Japan

[73] Assignee: Mitsui Petrochemical Industries, Ltd., Tokyo, Japan

[21] Appl. No.: 495,581

[22] Filed: Mar. 20, 1990

Related U.S. Application Data

[63] Continuation-in-part of Ser. No. 280,591, Dec. 6, 1988, abandoned.

[30] Foreign Application Priority Data

Dec. 8, 1987 [JP] Japan ................................. 62-310597
Dec. 8, 1987 [JP] Japan ................................. 62-310598
Dec. 8, 1987 [JP] Japan ................................. 62-310599

[51] Int. Cl.$^5$ ............................................. C08G 73/12
[52] U.S. Cl. .................................... 528/317; 528/170; 528/312; 528/315; 528/316; 528/318; 528/321; 528/322
[58] Field of Search ............... 528/322, 317, 315, 316, 528/318, 321, 170

[56] References Cited

U.S. PATENT DOCUMENTS

| | | | |
|---|---|---|---|
| 3,767,626 | 10/1973 | Laurent et al. | 528/322 |
| 3,878,172 | 4/1975 | Bargain et al. | 528/322 |
| 4,038,450 | 7/1977 | Balme et al. | 528/322 |
| 4,454,283 | 6/1984 | Street et al. | 528/322 |
| 4,777,237 | 10/1988 | Dien et al. | 528/322 |

*Primary Examiner*—Harold D. Anderson
*Attorney, Agent, or Firm*—Nixon & Vanderhye

[57] ABSTRACT

Imide prepolymer compositions containing an unsaturated component (A) and diamine component (B) at the (A)/(B) molar ratio of 0.9–1.5 and 0.01–5.0% by weight, based on the sum of said components (A) and (B), of at least one radical polymerization inhibitors, and preferably further 0.01–5.0% by weight, based on the sum of said components (A) and (B), of at least one compound selected from the group of carboxylic acid and carboxylic acid anhydride.

The imide prepolymer compositions of the present invention which contain the above-defined components in specific proportions are tough and excellent in adhesive strength to glass cloths and metals and in heat resistance.

19 Claims, No Drawings

IMIDE TYPE PREPOLYMER COMPOSITION COMPRISING UNSATURATED BIS IMIDE, DIAMINE, AND A TERTIARY BUTYL HYDROQUINONE POLYMERIZATION INHIBITOR

This is a continuation-in-part of U.S. patent application Ser. No. 07/280,591, filed Dec. 6, 1988 now abandoned.

FIELD OF THE INVENTION

This invention relates to imide prepolymer compositions and to processes for preparing the same, and more particularly to imide prepolymer compositions from which tough cured products are obtained, said cured products being excellent in adhesive strength to glass cloths and metals, flexibility and heat resistance, and to processes for preparing said prepolymer compositions.

BACKGROUND OF THE INVENTION

It has heretofore been known, for example, from Japanese Patent Publn. No. 7875/1973 that imide prepolymers are prepared by reacting bisimide with diamine in a solution state by using a high boiling solvent such as N-methylpyrrolidone, or heating the above-mentioned reactants to yield a molten mixture which is allowed to undergo reaction.

When the imide prepolymers thus obtained are cured by heating, cured products excellent in heat resistance are obtained. However, the cured products obtained have such a problem that they are brittle. In addition, they were not always satisfactory in point of tensile strength, tensile elongation or Izod impact strength.

When a laminate sheet is prepared by impregnating a glass cloth with a laminating varnish comprising this prepolymer, there is such a problem that the prepolymer exhibits only a low adhesive strength to glass cloths or metals such as copper.

Further, when this prepolymer is dissolved in polar solvents such as dimethylformamide, N-methylpyrrolidone and dimethylacetamide, a fairly large amount of insoluble portion thereof is left behind, and the insoluble portion rapidly increases in amount with increasing softening point of the prepolymer. On that account, there is such a problem that the preparation in the presence of the above-mentioned polar solvents of imide prepolymers having a high softening point involves difficulty.

Under these circumstances, the present inventors prosecuted extensive researches, in addition to unsaturated bisimides and diamines which are the starting materials for imide prepolymers, on the addition of radical polymerization inhibitors, carboxylic acids or acid anhydrides to the reaction system, and on the kind and mixing ratio thereof, and on the reaction conditions to be employed therefor, and eventually have accomplished the present invention on the basis of a finding that the above-mentioned problems can be solved at a single stroke by using at least one specific radical polymerization inhibitor in specific proportions.

OBJECT OF THE INVENTION

The present invention is intended to solve such problems associated with the prior art as mentioned above, and an object of the invention is to provide imide prepolymer compositions and processes for preparing the same, which imide prepolymer compositions are capable of improving heat-cured products obtained therefrom in brittleness and adhesive properties, and which are tough and excellent in adhesive strength to glass cloths or metals such as copper and also favorable in heat resistance.

SUMMARY OF THE INVENTION

The imide prepolymer composition according to the present invention comprises the following components (A) and (B) at the (A)/(B) molar ratio of 0.9–1.5, and 0.01–5.0% by weight, based on the sum of said components (A) and (B), of at least one radical polymerization inhibitor selected from the group consisting of t-butylhydroquinone and 2,5-di-t-butylhydroquinone, and preferably further 0.01–5.0% by weight, based on the sum of said component (A) and (B), of at least one compoound selected form the group consisting of carboxylic acids and carboxylic acid anhydrides.

Component (A): The component (A) includes unsaturated bisimides represented by the following general formula (I).

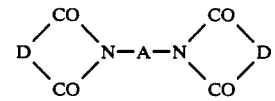

wherein D represents a divalent group containing a carbon-carbon double bond, and A represents a divalent group containing at least 2 carbon atoms.

Component (B): The component (B) includes diamines represented by the formula $H_2N-B-NH_2$ wherein B represents a divalent group containing less than 30 carbon atoms.

The processes for preparing imide prepolymer compositions of the present invention are comprising that a mixture of the components (A) and (B) at the (A)/(B) molar ratio of 0.9–1.5 is incorporated with 0.01–5.0% by weight, based on the sum of said components (A) and (B), of at least one radical polymerization inhibitor selected from the group consisting of t-butylhydroquinone and 2,5-di-t-butylhydroquinone, and preferably further 0.01–5.0% by weight, based on the sum of said component (A) and (B), of at least one compound selected from the group consisting of carboxylic acids and carboxylic acid anhydrides, and the resulting mixture is heated to undergo reaction.

Component (A): The component (A) includes unsaturated bisimides represented by the following general formula (I).

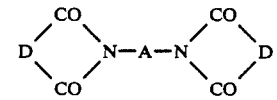

wherein D represents a divalent group containing a carbon-carbon double bond, and A represents a divalent group containing at least 2 carbon atoms.

Component (B): The component (B) includes diamines represented by the formula $H_2N-B-NH_2$ wherein B represents a divalent group containing less than 30 carbon atoms.

DETAILED DESCRIPTION OF THE INVENTION

The imide prepolymer compositions of the present invention and processes for preparing the same are illustrated in detail hereinafter.

The unsaturated bisimide (A) represented by the above-mentioned formula (I), which is used as one of the components of the imide prepolymer composition of the present invention, includes concretely such compounds, for example, those as listed below.

N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyl ether bismaleimide, N,N'-3,4'-diphenyl ether bismaleimide, N,N'-4,4'-diphenylsulfonebismaleimide, N,N'-m-xylenebismaleimide, N,N'-4,4'-cyclohexanebismaleimide, N,N'-4,4'-diphenylmethanebiscitraconimide, etc.

The diamine (B) mentioned above, which is used as one of the components of the imide prepolymer composition of the present invention, includes concretely such compounds, for example, those as listed below.

4,4'-Diaminodicyclohexylmethane, 1,4'-diaminocyclohexane, m-phenylene diamine, p-phenylenediamine, 4,4'-diaminodiphenylmethane, 4,4'-diaminodiphenyl ehter, 3,4'-diaminodiphenyl ether, 4,4'-diaminodiphenylsulfone, 4,4'-diaminodiphenylsulfide, m-xylenediamine, p-xylenediamine, 1,3-bis(p-aminocumyl)benzene, 1,4-bis-(p-aminocumyl)benzene, 1,3-bis(4-aminophenoxy)benzene, 1,4-bis(4-aminophenoxy)benzene, 2,2'-bis[4-(4-aminophenoxy)phenyl]propane, hexamethylenediamine, etc.

The radical polymerization inhibitor used in the present invention includes t-butylhydroquinone and 2,5-di-t-butylhydroquinone.

These radical polymerization inhibitors are used in an amount of 0.01–5.0% by weight based on the sum of the unsaturated bisimide and diamine.

These radical polymerization inhibitors are used to improve brittleness and adhesive properties to glass cloths or the like of cured products obtained by heating imide prepolymers. By incorporating these radical polymerization inhibitors in the above-mentioned range into imide prepolymer compositions, tensile strength, tensile elongation or Izod impact strength of cured products obtained therefrom is improved.

The imide prepolymer compositions according to the invention preferably further contain such carboxylic acid as enumerated below.

Aromatic monocarboxylic acids such as benzoic acid, o-toluic acid and its isomers, o-tert-butylbenzoic acid and its isomers, o-nitrobenzoic acid and its isomers, o-dichlorobenzoic acid and its isomers, o-bromobenzoic acid and its isomers, o-nitobenzoic acid and its isomers, o-hydroxybenzoic acid and its isomers, o-methoxybenzoic acid and its isomers, o-aminobenzoic acid and its isomers. Aromatic dicarboxylic acids such as phthalic acid and its isomers. Aromatic tricarboxylic acids such as trimellitic acid, and aromatic tetracarboxylic acids such as pyromellitic acid and benzophenonecarboxylic acid. Aliphatic monocarboxylic acids such as formic acid, acetic acid, propionic acid, phenylacetic acid, gluconic acid, lactic acid and tartaric acid. Aliphatic dicarboxylic acids such as malonic acid, succinic acid, glutaric acid, maleic acid and fumaric acid.

The imide prepolymer compositions according to the invention preferably further contain such carboxylic acid as listed below.

Acetic anhydride, propionic anhydride, succinic anhydride, maleic anhydride, tetrahydroxyphthalic anhydride, tetrahydroxymethyl phthalic anhydride, nadic anhydride, trimellitic acid anhydride, pyromellitic acid anhydride, and 3,3', -4,4'-benzophenonetetracarboxylic acid anhydride.

These carboxylic acids or acid anhydrides are used in an amount of 0.01–5.0% by weight based on the sum of the above-mentioned unsaturated bisimide (A) and diamine (B).

In order to prepare the imide prepolymers of the present invention, the aforementioned starting materials must be heated to undergo reaction. This reaction is carried out usually by heating for several minutes to several hours at a suitable temperature of from 100° up to 200° C.

In carrying out this reaction, the aforementioned component (B) is first fused by heating, and then the aforementioned component (A) is added thereto and the two components in a molten state is heated undergo reaction, whereupon the reaction proceeds smoothly.

Since the imide prepolymers of the present invention dissolve in inert polar solvents such as dimethylformamide, N-methylpyrrolidone, dimethylacetamide and the like, when the aforementioned starting materials are heated to undergo reaction in these solvents, the reaction proceeds smoothly and the imide prepolymers having excellent characteristics are obtained.

The imide prepolymers obtained in the manner as mentioned above dissolve in polar solvents such as dimethylformamide, N-methylpyrrolidone and dimethylacetamide, and hence a solution of imide prepolymer in said solvent is particularly useful as a laminating varnish for preparing laminate sheets.

The thus prepared prepolymers may be used in the form of solvent solution as aforesaid, or may be used in the form of powder after transforming them again into powder.

The thus obtained imide prepolymers may be cured directly by heating them at a temperature of about 180°–250° C., if desired, under pressure for 10 minutes to 2 hours.

In order that a cured product of this imide prepolymer exhibits its inherent physical properties, the cured product must be subjected to postcuring treatment for about 4–48 hours at a temperature of about 180°–250° C.

The imide prepolymer of the present invention may be incorporated, if necessary, with lubricants or mold release agents as enumerated below.

Fatty acid esters such as carnauba wax, beeswax, rice wax, stearic acid, butyl esters, etc., fatty acid amides such as ethylenebisstearoamide, fatty acids such as montanic acid, stearic acid, etc., and metal salts thereof, petroleum wax, polyethylene wax, polypropylene wax and oxidates thereof, and silicone oil such as polymethylsiloxane, polymethylphenylsiloxane, etc.

The amount of these lubricants or mold release agnets to be incorporated is preferably 0.1–5.0% by weight based on the sum (total amount) of the aforementioned unsaturated bisimide and diamine.

The imide prepolymer of the present invention may also be incorporated, if necessary, with rubber components such as amine-terminated butadiene nitrile rubber (ATBN) and the like, Teflon, silicone resins, phenol resins, aniline resins, etc. The amount of these additives to be incorporated is preferably 10–200% by weight based on the sum (total amount) of the aforementioned unsaturated bisimide and diamine.

Further, the imide prepolymers of the present invention may be incorporated, if necessary, with the following inorganic or organic substances as filler components.

Silica powder, alumina powder, glass powder, mica, talc, barium sulfate, titanium oxide, molybdenum disulfide, aluminum powder, iron powder, copper powder, metallic hydroxides such as aluminum hydroxide and magnesium hydroxide, microfine hollow bodies of silica, alumina, glass, phenol resins, etc., and reinforcing fibers such as glass fiber, alumina fiber, carbon fiber, Aramide fiber, silicon carbide fiber, aluminum fiber, copper fiber, etc.

The amount of these filler components to be incorporated is preferably 50–500% by weight based on the sum (total amount) of the aforementioned unsaturated bisimide and diamine.

EFFECT OF THE INVENTION

The imide prepolymers of the present invention have such a feature that when the present prepolymers are dissolved in inert polar solvents such as dimethylformamide, N-methylpyrrolidone and dimethylacetamide, the portion thereof which remains undissolved is very small in comparison with that of imide prepolymers prepared by conventional processes. On that account, in preparing the prepolymers of the present invention, it becomes possible to adopt such a process wherein the starting materials dissolved in these solvents are heated to undergo reaction. Further, even resins having high softening points can easily processed to varnish. By utilization of such properties of the present prepolymers as mentioned above, it is possible to provide cured products high in flexibility as well as excellent in heat resistance. The cured products thus obtained can be used for various purposes such as anti-friction materials, bearings, gearings, laminate sheets, adhesives, insulating varnishes, etc.

The cured products obtained by heat curing the imide prepolymers of the present invention are high in tensile strength, tensile elongation as well as in Izod impact strength as compared with cured products obtained by heat curing prepolymers obtained by the conventional processes.

Furthermore, when the imide prepolymers of the present invention are used as adhesives for laminate sheets, there is observed such an effect that T-peel peeling strength of copper foils or T-peel peeling strength between laminates becomes high.

The present invention is illustrated below with reference to examples, but it should be construed that the invention is in no way limited to those examples.

EXAMPLE 1

Into a separable flask were charged 35.6 g of 4,4'-diaminodiphenylmethane, 1.0 g of t-butylhydroquinone and 0.5 g of p-hydroxybenzoic acid, and the flask was immersed in an oil bath kept at 150° C. At the time when the 4,4'-diaminodiphenylmethane dissolved to form a homogeneous solution, to the resulting solution was added with stirring in 2 minutes 64.4 g of N,N'-4,4'-diphenylmethanebismaleimide. The resulting mixture was allowed to undergo reaction with stirring for 15 minutes, and then drawn from the flask into a vat. This vat was placed into an air oven kept at 160° C., aged therein for 45 minutes and then pulverized to obtain an imide prepolymer.

It was found that the imide prepolymer thus obtained dissolves in its entity in dimethylformamide.

This prepolymer was molded according to compression molding into a flat plate of 2 mm in thickness and a square bar having a sectional area of 12.7 mm × 12.7 mm under the conditions of 200° C., 30 minutes and 150 kgf/cm², and the moldings obtained were then subjected to postcuring treatment at 200° C. for 24 hours to obtain molded articles.

Physical properties of the molded articles thus obtained are shown in Table 1.

Comparative Example 1

Molded articles of imide prepolymer similar to those of Example 1 were obtained by repeating Example 1 except that the t-butylhydroquinone was not used.

Physical properties of the molded articles thus obtained are shown in Table 1.

Comparative Example 2

Molded articles of imide prepolymer similar to those of Example 1 were obtained by repeating Example 1 except that in place of 1.0 g of the t-butylhydroquinone and 0.5 g of the p-hydroxybenzoic acid, there was used 0.5 g of benzoic acid.

Physical properties of the molded articles thus obtained are shown in Table 1.

Comparative Example 3

Molded articles similar to those of Example 1 were obtained according to compression molding under the same conditions as in Example 1 using only a commercially available polyimide resin (a product of Nippon Polyimide K.K. sold under a trade name of Chelimide 1000).

Physical properties of the molded articles thus obtained are shown in Table 1.

EXAMPLE 2

Into a separable flask was charged 33.4 g of 4,4'-diaminodiphenylmethane, and the flask was immersed in an oil bath kept at 150° C. After the 4,4'-diaminodiphenylmethane dissolved, 0.5 g of 3,3',4,4'-benzophenonetetracarboxylic acid dianhydride was dissolved in the solution, and the mixed solution was allowed to undergo reaction. Subsequently, in this solution was dissolved with stirring 1.0 g of t-buytylhydroquinone and thereto was added in 2 minutes 66.6 g of N,N'-4,4'-diphenylmethanebismaleimide. This mixture was allowed to undergo reaction with stirring for 20 minutes, and the reaction mixture was then drawn from the flask into a vat. Then, this vat was placed in an oven kept at 160° C., and the reaction product was aged for 60 minutes and then pulverized to obtain an imide prepolymer.

From the prepolymer thus obtained, molded articles similar to those of Example 1 were obtained according to compression molding under the same conditions as in Example 1.

Physical properties of the molded articles thus obtained are shown in Table 1.

Comparative Example 4

Into a separable flask was charged 35.6 g of 4,4'-diaminodiphenylmethane, and the flask was immersed in an oil bath kept at 150° C. After the 4,4'-diaminodiphenylmethane dissolved, 1 g of 3,3',4,4'-benzophenonetetracarboxylic acid dianhydride was dissolved with stirring in this solution. To the resulting solution was added with stirring 64.4 g of N,N'-4,4'-diphenylmethanebismaleimide for 2 minutes. The resulting mixture was allowed to undergo reaction with stirring for 15 minutes, and the reaction product was drawn from the flask into a vat. Following the same procedure as in Example 1, there were obtained molded articles of imide prepolymer similar to those of Example 1.

Physical properties of the molded articles thus obtained are shown in Table 1.

Comparative Example 5

Molded articles of imide prepolymer were obtained by repeating Example 1 except that in place of 1.0 g of the t-butylhydroquinone and 0.5 g of p-hydroxybenzoic acid, there was used 0.5 g of hydroquinone, and the compression molding time was changed to 20 minutes.

Physical properties of the molded articles thus obtained are shown in Table 1.

Comparative Example 6

Molded articles of imide prepolymer similar to those of Example 1 were obtained by repeating Example 1 except that the t-butylhydroquinone and p-hydroxybenzoic acid were not used, and the compression molding time was changed to 20 minutes.

Physical properties of the molded articles thus obtained are shown in Table 1.

0.5 g of 1,1-diphenyl-2-picrylhydrazyl, and the compression molding time was changed to 20 minutes.

Physical properties of the molded articles thus obtained are shown in Table 1.

EXAMPLE 4

A separable flask was charged with 85.6 g of 4,4'-diaminodiphenylmethane and 1.0 g of t-butylhydroquinone, and the flask was immersed in an oil bath kept at 150° C. After the 4,4'-diaminodiphenylmethane melted and became a uniform melt, in this melt was added with stirring 64.4 g of N,N'-4,4'-diphenylmethanebismaleimide for 2 minutes. The resresulting mixture was alowed to undergo reaction with stirring for 15 minutes, and the reaction product was drawn from the flask into vat. Then, this vat was placed in an oven kept at 160° C. and the reaction product was aged for 45 minutes, cooled in the air and pulverized to obtain an imide prepolymer. All of the imide prepolymer thus obtained was dissolved in its entity in dimethylformamide.

This prepolymer was molded according to compression molding into a flat plate of 2 mm in thickness and square bar having a sectional area of 12.7 mm × 12.7 mm under the conditino of 200° C., 30 minutes and 150 Kgf/cm$^2$, and the moldings obtained were then subjected to postcuring treatment at 200° C., 24 hours to obtain molded articles.

Physical properties of the molded articles thus obtained are shown in Table 1.

TABLE 1

| | Tensile strength (kgf/mm$^2$) | Tensile elogation (%) | Izod impact strength [Notched] | Tg (°C.) | Insolubles of DMF (%) | Inhibitor and/or carboxylic acid |
| --- | --- | --- | --- | --- | --- | --- |
| Example 1 | 10.1 | 3.6 | 3.6 | 200 | 0 | t-butylhydroquinone, p-hydroxybenzoic acid |
| Compar. Ex 1 | 9.5 | 3.0 | 3.1 | 214 | | p-hydroxybenzoic acid |
| Compar. Ex 2 | 9.0 | 2.5 | 3.1 | 210 | | benzoic acid |
| Compar. Ex 3 | 5.0 | 1.1 | 0.9 | 225 | 58 | t-butylhydroquinone, p-hydroxybenzoic acid |
| Example 2 | 10.9 | 4.2 | 4.0 | 218 | | t-butylhydroquinone, 3,3',4,4'-benzophenonetetracarboxylic acid dianhydride |
| Compar. Ex 4 | 9.0 | 2.7 | 3.0 | 212 | | 3,3',4,4'-benzophenonetetracarboxylic acid dianhydride |
| Compar. Ex 5 | 9.0 | 2.7 | 3.0 | 214 | 0 | hydroquinone |
| Compar. Ex 6 | 6.0 | 1.7 | 2.0 | 218 | 68 | |
| Example 3 | 9.5 | 3.2 | 3.0 | 208 | | 2,5-di-t-butylhydroquinone |
| Compar. Ex 7 | 9.0 | 2.9 | 3.2 | 211 | | 1,1-diphenyl-2-picrylhydrazyl |
| Example 4 | 9.2 | 3.0 | 3.1 | 215 | 0 | t-butylhydroquinone |

*Tg was measured using TMA at a heating rate of 10° C./min.

EXAMPLE 3

Molded articles of imide prepolymer similar to those of Example 1 were obtained by repeating Example 1 except that in place of 1.0 g of the t-butylhydroquinone and 0.5 g of the p-hydroxybenzoic acid, there was used 0.25 g of 2,5-di-t-butylhydroquinone, the ageing time was changed to 50 minutes, and the compression molding time was changed to 20 minutes.

Physical properties of the molded articles thus obtained are shown in Table 1.

Comparative Example 7

Molded articles of imide prepolymer similar to those of Example 1 were obtained by repeating Example 1 except that in place of 1.0 g of the t-butylhydroquinone and 0.5 g of the p-hydroxybenzoic acid, there was used

EXAMPLE 5

A separable flask charged with 150 g of dimethylformamide, 50.2 g of 4,4'-diaminodiphenylmethane and 0.75 g of 3,3',4,4'-benzophenonetetracarboxylic acid was immersed in an oil bath. At the time when the temperature of the liquid in the flask reached 100° C., 1.5 g of t-butylhydroquinone and 99.8 g of N,N'-4,4'-diphenylmethanebismaleimide were added to the contents of the flask, and the mixture was maintained at 100° C. with stirring and allowed to undergo reaction for 3 hours.

A glass cloth was impregnated with the thus obtained varnish, and the impregnated glass cloth was dried at 160° C. for 5 minutes to prepare a prepreg. Nine sheets of this prepreg were laminated together to form a laminate, a copper foil of one ounce was placed on both the top and bottom of the laminate, the resulting laminate was compression molded at 180° C. for 60 minutes and then subjected to postcuring treatment at 200° C. for 24 hours, whereby a copper-clad laminate sheet was prepared.

The laminate sheet thus obtained was measured for T-peel peeling strength of the copper foils and that of the lamination layers.

The results of measurement are shown in Table 2.

Comparative Example 8

Using a commercially available polyimide resin (a product of Nippon Polyimide K.K. sold under a trade name of Chelimide 601), prepregs were prepared and therefrom a copper-clad laminate sheet was prepared under the same conditions as in Example 5. Physical properties of the thus prepared copper-clad laminate sheet were measured.

The results obtained are shown in Table 2.

Comparative Example 9

To a separable flask charged with 150 g of dimethylformamide were added 53.4 g of 4,4'-diaminodiphenylmethane, 96.6 g of N,N'-4,4'-diphenylmethanebismaleimide and 0.75 g of p-hydroxybenzoic acid. The mixture in the flask was stirred and the temperature of the liquid was maintained at 100° C. to undergo reaction for 3 hours.

A glass cloth was impregnated with the thus obtained varnish and the impregnated glass cloth was dried at 160° C. for 5 minutes to prepare a prepreg. Nine sheets of this prepreg were laminated together to form a laminate, a copper foil of 1 ounce was placed on both the top and botton of the laminate, the resulting laminate was compression molded at 180° C. for 60 minutes and then subjected to postcuring treatment at 200° C. for 24 hours, whereby a copper-clad laminate sheet was prepared.

The laminate sheet thus obtained was measured for T-peel peeling strength of the copper foils and that of the lamination layers.

The results of measurement are shown in Table 2.

Comparative Example 10

Using commercially available polyimide resin (a product of Nippon Polyimide K.K. sold under a trade name of Chelimide 601), prepregs were prepared and therefrom a copper-clad laminate sheet was prepared under the same conditions as in Comparative Example 9. Physical properties of the copper-clad laminate sheet thus obtained were measured.

The results obtained are shown in Table 2.

Comparative Example 11

A copper-clad laminate sheet was prepared by repeating Comparative Example 9 except that in place of 0.75 g of the p-hydroxybenzoic acid, there was used 0.75 g of hydroquinone, and the compression molding time was changed to 30 minutes. The copper-clad laminate sheet thus obtained was measured for T-peel peeling strength of the copper foils and that of the lamination layers.

The results of measurement obtained are shown in Table 2.

Comparative Example 12

A copper-clad laminate sheet was prepared by repeating Comparative Example 9 except that in place of the vanish used therein, there was used a commercially available polyimide resin (a product of Nippon Polymide K.K. sold under a trade name of Chelimide 601). The copper-clad laminate sheet thus obtained was measured for T-peel peeling strength of the copper foils and that of the lamination layers.

The results of measurement obtained are shown in Table 2.

TABLE 2

| | T-peel peeling strength of copper foil (kgf/cm) | T-peel peeling strength of lamination layer (kgf/cm) | Tg (°C.) |
|---|---|---|---|
| Example 5 | 1.8 | 2.0 | |
| Compar. Ex. 8 | 1.1 | 1.0 | |
| Compar. Ex. 9 | 1.8 | 1.8 | |
| Compar. Ex. 10 | 1.1 | 1.0 | |
| Compar. Ex. 11 | 1.8 | 1.8 | 205 |
| Compar. Ex. 12 | 1.0 | 1.0 | |

*Tg was measured using TMA at a heating rate of 10° C./min.

What is claimed is:

1. An imide prepolymer composition comprising the following components (A) and (B) at the (A)/(B) molar ratio of 0.9-1.5 and 0.01-5.0% by weight, based on the sum of said components (A) and (B), of at least one radical polymerization inhibitor selected from the group consisting of t-butylhydroquinone and 2,5-di-t-butylhydroquinone, component (A) being an unsaturated bisimide represented by the following formula (I):

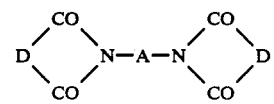

wherein D represents a divalent group containing a carbon-carbon double bond, and A represents a divalent group containing at least 2 carbon atoms, and component (B) being a diamine represented by $H_2N$—B—$NH_2$ wherein B represents a divalent group containing less than 30 carbon atoms.

2. The composition as claimed in claim 1, wherein component (A) is N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyl ether lismaleimide, N,N'-3,4'-diphenyl ether bismaleimide, N,N'-diphenylsulfonebismaleimide, N,N'-m-xylenebismaleimide, N,N'-4,4'-cyclohexanebismaleimide or N,N'-4,4'-diphenylmethanebiscitraconimide.

3. The composition as claimed in claim 1 wherein the component (B) is 4,4'-diaminodicyclohexymethane, 1,4'-diaminocyclohexane, m-phenylenediamine, p-phenylenediamine, 4,4'-diaminodiphenylmethane, 4,4'-diaminodiphenyl ether, 3,4'-diaminodiphenyl ether, 4,4'-diaminodiphenylsulfone, 4,4'-diaminodiphenylsulfide, m-xylenediamine, p-xylenediamine, 1,3-bis(p-aminocumyl)benzene, 1,4-bis-(p-aminocumyl)benzene, 1,3-bis(4-aminophenoxy)benzene, 1,4-bis(4-aminophenoxy)benzene, 2,2-bis[4-(4-aminophenoxy)phenyl]propane or hexamethylenediamine.

4. An imide prepolymer composition comprising the following components (A) and (B) at the (A)/(B) molar ratio of 0.9–1.5, 0.01–5.0% by weight, based on the sum of said components (A) and (B), of at least one radical polymerization inhibitor selected from the group consisting of t-butylhydroquinone and 2,5-di-t-butylhydroquinone, and 0.01–5.0% by weight, based on the sum of said components (A) and (B), of at least one compound selected from the group consisting of carboxylic acid and carboxylic acid anhydride, component (A) being an unsaturated bisimide represented by the following formula (I):

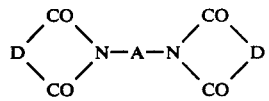

wherein D represents a divalent group containing a carbon-carbon double bond, and A represents a divalent group containing at least 2 carbon atoms, and component (B) being a diamine represented by H$_2$N—B—NH$_2$ wherein B represents a divalent group containing less than 30 carbon atoms.

5. The composition as claimed in claim 4, wherein component (A) is N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyl ether lismaleimide, N,N'-3,4'-diphenyl ether bismaleimide, N,N'-diphenylsulfonebismaleimide, N,N'-m-xylenebismaleimide, N,N'-4,4'-cyclohexanebismaleimide or N,N'-4,4'-diphenylmethanebiscitraconimide.

6. The composition as claimed in claim 4 wherein the component (B) is 4,4'-diaminodicyclohexymethane, 1,4'-diaminocyclohexane, m-phenylenediamine, p-phenylenediamine, 4,4'-diaminodiphenylmethane, 4,4'-diaminodiphenyl ether, 3,4'-diaminodiphenyl ether, 4,4'-diaminodiphenylsulfone, 4,4'-diaminodiphenylsulfide, m-xylenediamine, p-xylenediamine, 1,3-bis(p-aminocumyl)benzene, 1,4-bis-(p-aminocumyl)benzene, 1,3-bis(4-aminophenoxy)benzene, 1,4-bis(4-aminophenoxy)benzene, 2,2-bis[4-(4-aminophenoxy)phenyl]propane or hexamethylenediamine.

7. The composition as claimed in claim 4 wherein the carboxylic acid is selected from the group consisting of benzoic acid, o-toluic acid, isomer thereof, o-tert-butylbenzoic acid, isomer thereof, o-chlorobenzoic acid, isomer thereof, o-dichlorobenzoic acid, isomer thereof, o-bromobenzoic acid, isomer thereof, o-nitrobenzoic acid, isomer thereof, o-hydroxybenzoic acid, isomer thereof, o-methoxybenzoic acid, isomer thereof, o-aminobenzoic acid, isomer thereof, phthalic acid, isomer thereof, trimellitic acid, pyromellitic acid, benzophenonetetracarboxylic acid, formic acid, acetic acid, propionic acid, gluconic acid, lactic acid, tartaric acid, malonic acid, succinic acid, glutaric acid, maleic acid and fumaric acid.

8. The composition as claimed in claim 4 wherein the carboxylic acid anhydride is selected from the group consisting of acetic anhydride, propionic anhydride, succinic anhydride, maleic anhydride, tetrahydroxyphthalic anhydride, tetrahydroxymethylphthalic anhydride, nadic anhydride, trimellitic acid anhydride, pyromellitic acid dianhydride or 3,3',4,4'-benzophenonetetracarboxylic acid dianhydride.

9. A process for preparing an imide prepolymer composition, said process comprising the steps of incorporating a mixture of the following components (A) and (B) at a (A)/(B) molar ratio of 0.9–1.5 with 0.01–5.0% by weight, based on the sum of said components (A) and (B), of at least one radical polymerization inhibitor selected from the group consisting of t-butylhydroquinone and 2,5-di-t-butylhydroquinone, and heating the resulting mixture to cause reaction, said component (A) being an unsaturated bisimide represented by the following general formula (I):

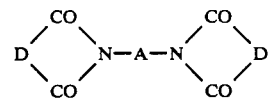

wherein D represents a divalent group containing a carbon-carbon double bond, and A represents a divalent group containing at least 2 carbon atoms and component (B) being a diamine represented by H$_2$N—B—NH$_2$ wherein B represents a divalent group containing less than 30 carbon atoms.

10. The process as claimed in claim 9 wherein the component (A) is N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyl ether bismaleimide, N,N'-3,4'-diphenyl ether bismaleimide, N,N'-4,4'-diphenylsulfonebismaleimide, N,N'-m-xylenebismaleimide, N,N'-4,4'-cyclohexanebismaleimide or N,N'-4,4'-diphenylmethanebiscitraconimide.

11. The process as claimed in claim 9 wherein the component (B) is 4,4'-diaminodicyclohexylmethane, 1,4'-diaminocyclohexane, m-phenylenediamine, p-phenylenediamine, 4,4'-diaminodiphenylmethane, 4,4'-diaminodiphenyl ether, 3,4'-diaminodiphenyl ether, 4,4'-diaminodiphenylsulfone, 4,4'-diaminodiphenylsulfide, m-xylenediamine, p-xylenediamine, 1,3-bis(p-aminocumyl)benzene, 1,4-bis-(p-aminocumyl)benzene, 1,3-bis(4-aminophenoxy)benzene, 1,4-bis(4-aminophenoxy)benzene, 2,2'-bis[4-(4-aminophenoxy)phenyl]propane or hexamethylenediamine.

12. A process for preparing an imide prepolymer composition, said process comprising the steps of incorporating a mixture of the following components (A) and (B) at a (A)/(B) molar ratio of 0.9–1.5 with 0.01–5.0% by weight, based on the sum of said components (A) and (B), of at least one radical polymerization inhibitor selected from the group consisting of t-butylhydroquinone and 2,5-di-t-butylhydroquinone and 0.01–5.0% by weight, based on the sum of said components (A) and (B), of at least one compound selected from the group consisting of carboxylic acid and carboxylic acid anhydride, and heating the resulting mixture to cause reaction, said component (A) being an unsaturated bisimide represented by the following general formula (I):

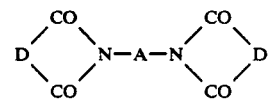

wherein D represents a divalent group containing a carbon-carbon double bond, and A represents a divalent group containing at least 2 carbon atoms and component (B) being a diamine represented by H$_2$N—B—NH$_2$ wherein B represents a divalent group containing less than 30 carbon atoms.

13. The process as claimed in claim 12 wherein the component (A) is N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyl ether bismaleimide, N,N'-3,4'-diphenyl ether bismaleimide, N,N'-4,4'-diphenylsulfonebismaleimide, N,N'-m-xylenebismaleimide, N,N'-4,4'-cyclohexanebismaleimide or N,N'-4,4'-diphenylmethanebiscitraconimide.

14. The process as claimed in claim 12 wherein the component (B) is 4,4'-diaminodicyclohexylmethane, 1,4'-diaminocyclohexane, m-phenylenediamine, p-phenylenediamine, 4,4'-diaminodiphenylmethane, 4,4'-diaminodiphenyl ether, 3,4'-diaminodiphenyl ether, 4,4'-diaminodiphenylsulfone, 4,4'-diaminodiphenylsulfide, m-xylenediamine, p-xylenediamine, 1,3-bis(p-aminocumyl)benzene, 1,4-bis-(p-aminocumyl)benzene, 1,3-bis(4-aminophenoxy)benzene, 1,4-bis(4-aminophenoxy)benzene, 2,2-bis[4-(4-aminophenoxy)phenyl]propane or hexamethylenediamine.

15. The process as claimed in claim 12 wherein the carboxylic acid is selected from the group consisting of benzoic acid, o-toluic acid, isomer thereof, o-tert-butylbenzoic acid, isomer thereof, o-chlorobenzoic acid, isomer thereof, o-dichlorobenzoic acid, isomer thereof, o-bromobenzoic acid, isomer thereof, o-nitrobenzoic acid, isomer thereof, o-hydroxybenzoic acid, isomer thereof, o-methoxybenzoic acid, isomer thereof, o-aminobenzoic acid, isomer thereof, phthalic acid, isomer thereof, trimellitic acid, pyromellitic acid, benzophenonetetracarboxylic acid, formic acid, acetic acid, propionic acid, phenylacetic acid, gluconic acid, lactic acid, tartaric acid, malonic acid, succinic acid, glutaric acid, maleic acid and fumaric acid.

16. The process as claimed in claim 12, wherein the carboxylic acid anhydride is selected from the group consisting of acetic anhydride, propionic anhydride, succinic anhydride, maleic anhydride, tetrahydroxyphthalic anhydride, tetrahydroxymethylphthalic anhydride, nadic anhydride, trimellitic acid anhydride, pyromellitic acid dianhydride or 3,3',4,4'-benzophenonetetracarboxylic acid dianhydride.

17. A process for preparing the imide prepolymer composition as claimed in claim 1, wherein the component (B) is previously fused by heating, the component (A) is then added thereto, and the mixture in the molten state is heated at 100°–200° C. to undergo reaction.

18. The process as claimed in claim 17 wherein the reaction of the mixture is carried out in an inert polar solvent.

19. The process as claimed in claim 18, wherein the inert polar solvent is selected from the group consisting of dimethylformamide, N-methylpyrrolidone and dimethylacetamide.

* * * * *

UNITED STATES PATENT AND TRADEMARK OFFICE
CERTIFICATE OF CORRECTION

PATENT NO. : 4,987,214

DATED : January 22, 1991

INVENTOR(S) : KAN et al

It is certified that error appears in the above-identified patent and that said Letters Patent is hereby corrected as shown below:

Column 3 line 27 delete "ehter" and replace by --ether--

Column 3 line 33 delete "2,2'-bis[4-(4-aminophenoxy) phenyl]propane" and replace by --2,2-bis[4-(aminophenoxy) phenyl]propane--

Column 10 line 54 delete "ether lismaleimide" and replace by --ether bismaleimide--

Column 11 line 30 delete "ether lismaleimide" and replace by --ether bismaleimide--

Column 12 line 41 delete "2,2'-bis[4-(4-aminophenoxy) phenyl]-" and replace by --2,2-bis[4-(4-aminophenoxy) phenyl]- --

Signed and Sealed this

Sixth Day of October, 1992

Attest:

DOUGLAS B. COMER

*Attesting Officer*   Acting Commissioner of Patents and Trademarks